United States Patent
Nam et al.

(10) Patent No.: US 8,901,526 B2
(45) Date of Patent: Dec. 2, 2014

(54) VARIABLE RESISTIVE MEMORY DEVICE

(71) Applicants: Ki-hyung Nam, Yongin-si (KR);
Yong-kwan Kim, Yongin-si (KR);
Ho-joong Lee, Anyang-si (KR);
Pulunsol Cho, Gwacheon-si (KR)

(72) Inventors: Ki-hyung Nam, Yongin-si (KR);
Yong-kwan Kim, Yongin-si (KR);
Ho-joong Lee, Anyang-si (KR);
Pulunsol Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/753,712

(22) Filed: Jan. 30, 2013

(65) Prior Publication Data
US 2013/0221306 A1 Aug. 29, 2013

(30) Foreign Application Priority Data
Feb. 28, 2012 (KR) .......................... 10-2012-0020401

(51) Int. Cl.
*H01L 29/00* (2006.01)
*H01L 45/00* (2006.01)
*H01L 27/22* (2006.01)

(52) U.S. Cl.
CPC .......... *H01L 45/1253* (2013.01); *H01L 27/228* (2013.01)
USPC ................ 257/1; 257/2; 257/5; 257/E21.253; 438/102; 438/128; 438/129; 438/587

(58) Field of Classification Search
CPC .................................................. H01L 45/1253
USPC .......... 257/2–5, 334, 343, E21.253, E29.239; 438/102, 128–129, 217, 587
See application file for complete search history.

(56) References Cited

U.S. PATENT DOCUMENTS

| | | | |
|---|---|---|---|
| 6,063,680 | A | 5/2000 | Wu |
| 6,291,860 | B1 * | 9/2001 | Lukanc .......................... 257/382 |
| 6,440,867 | B1 | 8/2002 | Besser et al. |
| 6,440,868 | B1 | 8/2002 | Besser et al. |
| 6,589,866 | B1 | 7/2003 | Besser et al. |
| 6,642,130 | B2 | 11/2003 | Park |
| 7,067,379 | B2 | 6/2006 | Wen et al. |
| 7,294,890 | B2 | 11/2007 | Lo et al. |
| 7,682,914 | B2 | 3/2010 | Lo et al. |
| 7,977,236 | B2 | 7/2011 | Nejad et al. |
| 2004/0161881 | A1 * | 8/2004 | Shin et al. ...................... 438/128 |
| 2006/0113675 | A1 | 6/2006 | Chang et al. |
| 2006/0199343 | A1 | 9/2006 | Jung et al. |
| 2007/0045695 | A1 | 3/2007 | Takeoka et al. |
| 2008/0280432 | A1 | 11/2008 | Chang et al. |
| 2009/0159976 | A1 | 6/2009 | Goldbach et al. |

(Continued)

FOREIGN PATENT DOCUMENTS

| | | |
|---|---|---|
| JP | 2005150565 A | 6/2005 |
| KR | 20050066186 A | 6/2005 |
| KR | 20110024494 A | 3/2011 |

*Primary Examiner* — Mark A Laurenzi
(74) *Attorney, Agent, or Firm* — Harness, Dickey & Pierce, P.L.C.

(57) ABSTRACT

A variable resistive memory device capable of reducing contact resistance by including a contact layer having low contact resistance, the variable resistive memory device including a substrate comprising an active region; a gate line on the substrate; a first contact layer electrically connected to the active region; a memory cell contact plug electrically connected to the first contact layer; and a variable resistive memory cell electrically connected to the memory cell contact plug, wherein the first contact layer has less contact resistance with respect to the active region than the memory cell contact plug.

20 Claims, 15 Drawing Sheets

(56) References Cited

U.S. PATENT DOCUMENTS

| | | | |
|---|---|---|---|
| 2009/0267231 A1* | 10/2009 | Kim | 257/757 |
| 2010/0001356 A1 | 1/2010 | Kim | |
| 2011/0037111 A1 | 2/2011 | Kim et al. | |
| 2011/0122674 A1 | 5/2011 | Lin et al. | |
| 2012/0086074 A1* | 4/2012 | Hwang et al. | 257/334 |

\* cited by examiner

7000

US 8,901,526 B2

VARIABLE RESISTIVE MEMORY DEVICE

CROSS-REFERENCE TO RELATED APPLICATIONS

This application claims the benefit of Korean Patent Application No. 10-2012-0020401, filed on Feb. 28, 2012, in the Korean Intellectual Property Office, the disclosure of which is incorporated herein in its entirety by reference.

BACKGROUND

Example embodiments of inventive concepts relate to semiconductor devices, and more particularly, to a variable resistive memory device.

A semiconductor product requires high-capacity data processing ability even while the volume is gradually decreased. There is demand to increase an operation speed and a degree of integration of a memory device used for the semiconductor product. As existing flash memory reaches the limit of scaling, non-volatile memory devices using a variable resistive material gain attention as a replacement memory.

SUMMARY

According to some example embodiments of inventive concepts, there is provided a variable resistive memory device comprising: a substrate comprising an active region; a gate line on the substrate; a first contact layer electrically connected to the active region; a memory cell contact plug electrically connected to the first contact layer; and a variable resistive memory cell electrically connected to the memory cell contact plug, wherein the first contact layer has less contact resistance with respect to the active region than the memory cell contact plug.

In some example embodiments of inventive concepts, the first contact layer may be buried in the substrate.

In some example embodiments of inventive concepts, a top surface of the first contact layer may be level with a top surface of the gate line.

In some example embodiments of inventive concepts, a bottom surface of the first contact layer may be level with the top surface of the gate line.

In some example embodiments of inventive concepts, the first contact layer may be between the gate lines.

In some example embodiments of inventive concepts, the first contact layer may be on an area between the gate lines.

In some example embodiments of inventive concepts, the first contact layer may include a metal silicide material.

In some example embodiments of inventive concepts, the variable resistive memory device may further include: a second contact layer electrically connected to the active region; a source line contact plug electrically connected to the second contact layer; and a source line electrically connected to the source line contact plug, wherein the second contact layer has less contact resistance with respect to the active region than the source line contact plug.

In some example embodiments of inventive concepts, the second contact layer may be buried in the substrate.

In some example embodiments of inventive concepts, the first contact layer and the second contact layer may include the same material.

In some example embodiments of inventive concepts, the gate line may be buried in the substrate.

In some example embodiments of inventive concepts, the gate line may be on the substrate.

In some example embodiments of inventive concepts, the first contact layer may include at least one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb).

In some example embodiments of inventive concepts, the second contact layer may include at least one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb).

According to other example embodiments of inventive concepts, there is provided a variable resistive memory device comprising: a substrate; a contact plug on the substrate; and a contact layer interposed between the substrate and the contact plug and having less contact resistance with respect to the substrate than the contact plug.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
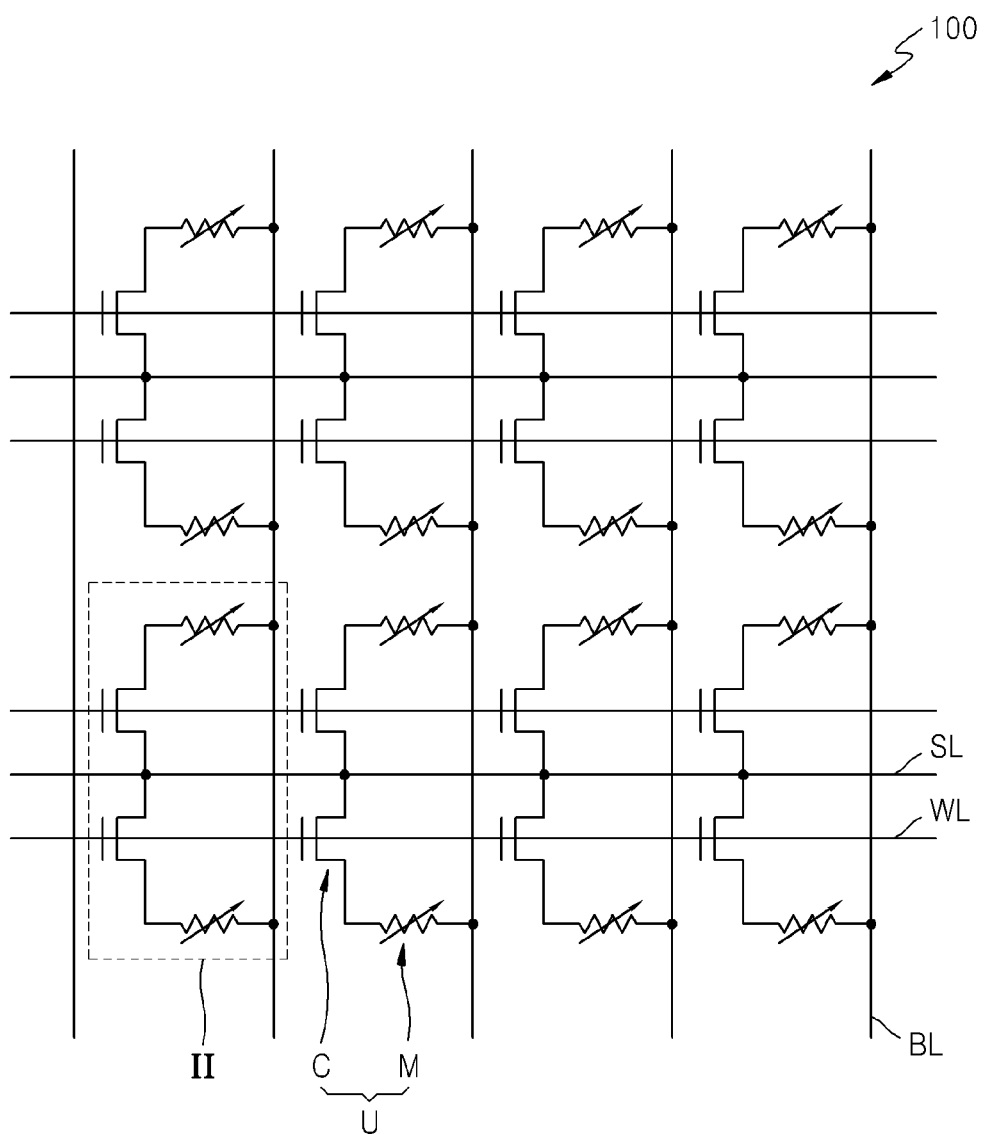
FIG. 1 is a circuit diagram of a variable resistive memory array according to some example embodiments of inventive concepts.

Reference will now be made in detail to example embodiments, examples of which are illustrated in the accompanying drawings. However, example embodiments are not limited to the example embodiments illustrated hereinafter, and the example embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "above" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A magnetic random access memory (MRAM) will now be illustrated as a variable resistive memory. However, example embodiments of inventive concepts are not limited thereto, and the variable resistive memory may be a phase change RAM (PCRAM), a resistive RAM (RRAM), or the like.

FIG. 1 is a circuit diagram of a variable resistive memory array 100 according to some example embodiments of inventive concepts.

Referring to FIG. 1, the variable resistive memory array 100 may include a plurality of unit cells U of a plurality of variable resistive memory devices arranged in a matrix form. Each of the unit cells U of the variable resistive memory device may include an access portion C and a memory portion M. Each of the unit cells U of the variable resistive memory device may be electrically connected to a word line WL and a bit line BL. When the access portion C is a transistor as illustrated in FIG. 1, the unit cell U of the variable resistive memory device may further include a source line SL that is electrically connected to a source region of the access portion C. The word line WL and the bit line BL may be arranged at a certain angle, for example, at a right angle, in two dimensions. Furthermore, the word line WL and the bit line BL may be arranged at a certain angle or arranged to be parallel to each other. The source line SL may be a common source line for the unit cells U of the variable resistive memory device.

The access portion C may control supply of current to the memory portion M according to a voltage of the word line WL. The access portion C may be a MOS transistor, a bipolar transistor, or a diode.

The memory portion M may include a variable resistive material, for example, a magnetic material, or a magnetic tunnel junction (MTJ). The memory portion M may perform a memory function by using a resistance variation due to a spin transfer torque (STT) phenomenon in which a magnetization direction of a magnetic body is changed according to an input current.

Figure 2:
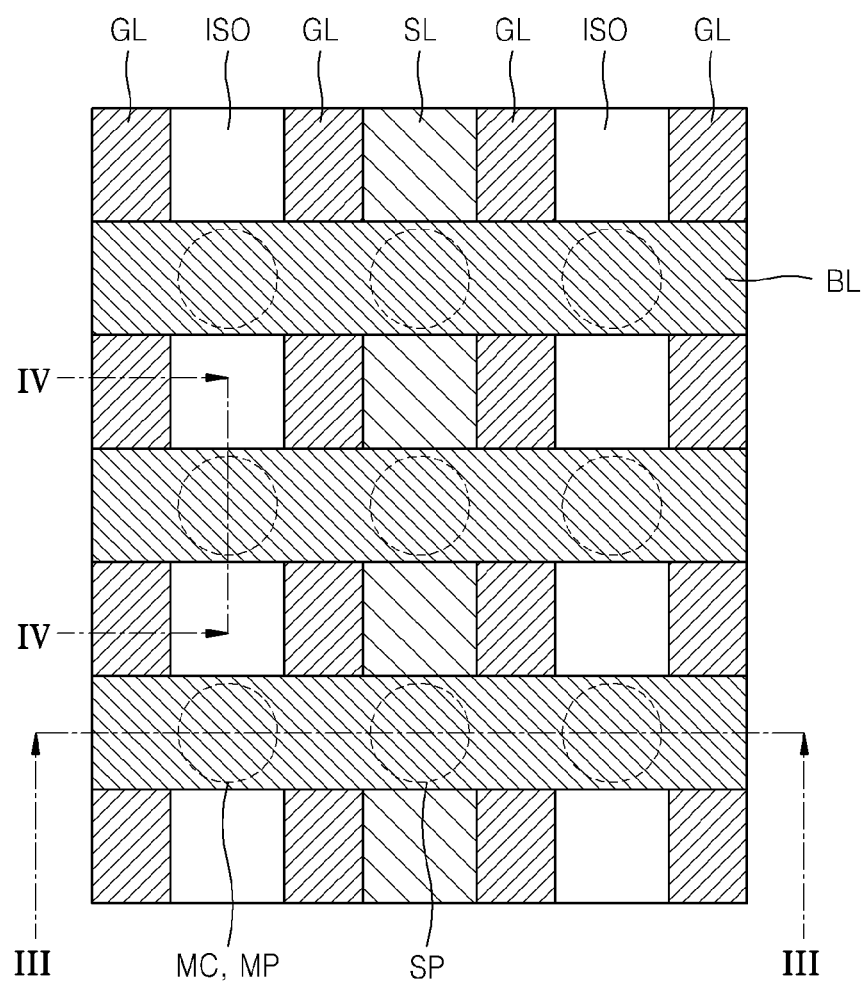
FIG. 2 is a top view of the variable resistive memory array illustrated in FIG. 1, according to some example embodiments of inventive concepts.

FIG. 2 is a top view of the variable resistive memory array 100, according to some example embodiments of inventive concepts. FIG. 2 shows a region II of FIG. 1.

Referring to FIG. 2, the variable resistive memory array 100 may include a bit line BL extending in a first direction and a source line SL and a gate line GL extending in a second direction that forms a predetermined angle with the first direction. The predetermined angle may be a right angle or any other angle. The first direction may be an x direction, for example, and the second direction may be a y direction, for example.

The source line SL may be in the center and may overlap at least a part of the bit line BL. However, the source line SL does not physically contact the bit line BL. In an area where the source line SL overlaps the bit line BL, there may be a source line contact plug SP that electrically connects a substrate 10 (see FIG. 3) to the source line SL. The position of the source line contact plug SP is not limited thereto, and only a part of the source line contact plug SP may overlap the bit line BL or the source line SL may not overlap the bit line BL.

Gate lines GL may be on both sides of the source line SL, respectively. A variable resistive memory cell MC may be on a side of the gate line GL that is opposite to the source line SL. The variable resistive memory cell MC may overlap the bit line BL. The position of the variable resistive memory cell MC is not limited thereto, and only a part of the variable resistive memory cell MC may overlap the bit line BL or the variable resistive memory cell MC may not overlap the bit line BL. The variable resistive memory cell MC may overlap a memory cell contact plug MP located below the variable resistive memory cell MC.

The variable resistive memory cell MC is electrically connected to the bit line BL. The source line SL does not physically contact the gate line GL. A memory cell contact plug MP may be below the variable resistive memory cell MC. The source line SL may be a common source line that is shared by variable resistive memory cells MC on both sides of the source line SL.

The gate lines GL may correspond to the word lines WL of FIG. 1, and the variable resistive memory cells MC may correspond to the memory portions M of FIG. 1. An insulation layer ISO formed of an insulation material may be located between two adjacent gate lines GL.

Figure 3:
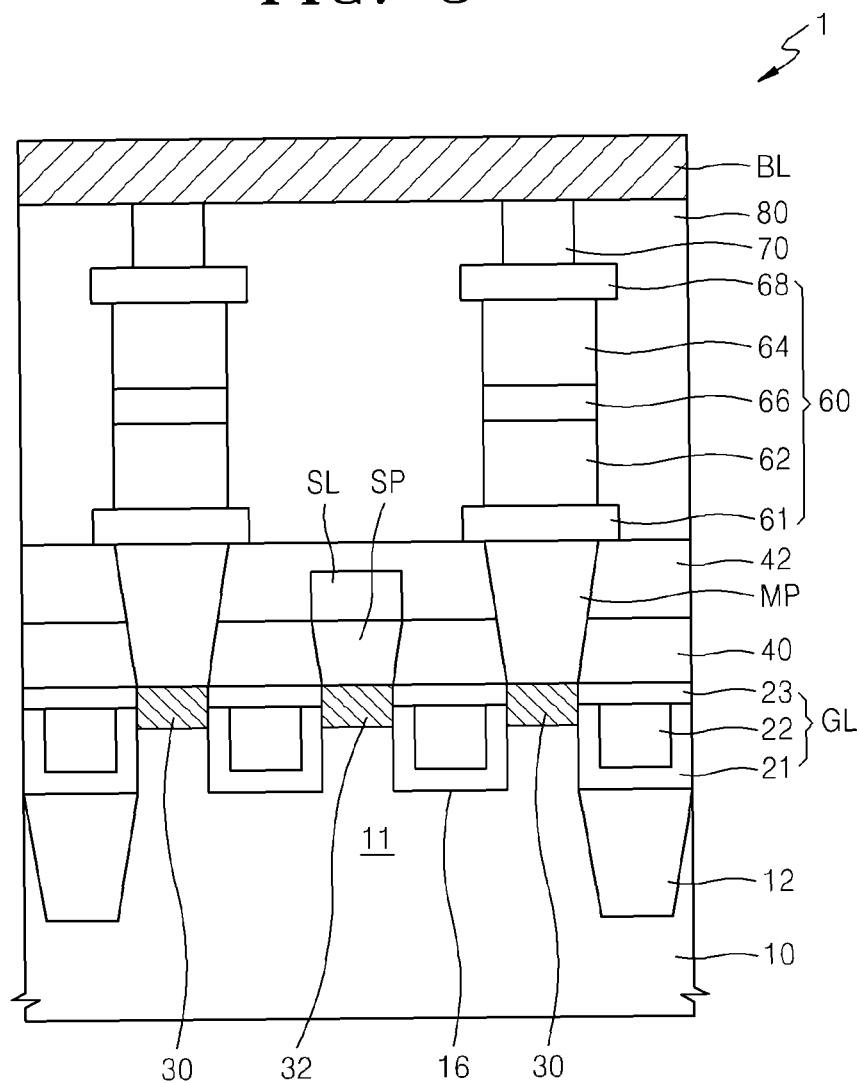
FIG. 3 is a cross-sectional view of a variable resistive memory device taken along line III-III of FIG. 2, according to some example embodiments of inventive concepts.

FIG. 3 is a cross-sectional view of a variable resistive memory device 1 taken along line III-III of FIG. 2, according to some example embodiments of inventive concepts.

Referring to FIG. 3, the variable resistive memory device 1 may include a substrate 10, a gate line GL, a variable resistive memory cell 60, a source line SL, and a bit line BL. The variable resistive memory cell 60 may correspond to the variable resistive memory cell MC of FIG. 2.

The gate line GL may be electrically connected to the variable resistive memory cell 60, and the gate line GL may be electrically connected to the source line SL.

The variable resistive memory device 1 may further include a source line contact plug SP electrically connecting the source line SL to an active region 11 of the substrate 10, and a memory cell contact plug MP electrically connecting the variable resistive memory cell 60 to the active region 11 of the substrate 10.

The variable resistive memory device 1 may further include a first contact layer 30. The first contact layer 30 may be between the memory cell contact plug MP and the active region 11 of the substrate 10, and may have less contact resistance with respect to the active region 11 of the substrate 10 than the memory cell contact plug MP.

The variable resistive memory device 1 may further include a second contact layer 32. The second contact layer 32 may be between the source line contact plug SP and the active region 11 of the substrate 10, and may have less contact resistance with respect to the active region 11 of the substrate 10 than the source line contact plug SP.

The substrate 10 may include a semiconductor layer including silicon (Si), silicon-germanium (SiGe), and/or silicon carbide (SiC). Also, the substrate 10 may include an epitaxial layer, a silicon-on-insulator (SOI) layer, and/or a semiconductor-on-insulator (SEOI) layer. Also, although it is not illustrated, the substrate 10 may further include a conductive line such as word line or a bit line or other semiconductor devices. The substrate 10 may further include a conductive layer including titanium (Ti), titanium nitride (TiN), aluminum (Al), tantalum (Ta), tantalum nitride (TaN), and/or tantalum aluminum nitride (TaAlN), or a dielectric layer including silicon oxide, titanium oxide, aluminum oxide, zirconium oxide, or hafnium oxide.

The substrate 10 may include an isolation layer 12 for defining the active region 11. The isolation layer 12 may be formed using a typical shallow trench isolation (STI) method. The active region 11 may include impurities, and thus may function as a source region and a drain region. The active region 11 may provide a channel region of the gate line GL.

The gate line GL may be buried in a trench 16 formed in the substrate 10. According to an example embodiment, the gate line GL may constitute a buried transistor. The gate line GL may include a gate insulation layer 21 formed on the bottom and side walls of the trench 16, a gate electrode layer 22 formed in the gate insulation layer 21, and a capping layer 23 formed on the gate electrode layer 22. The active region 11 may contact the bottom and side walls of the gate line GL. The gate electrode layer 22 may be the word line WL of FIG. 1. The gate line GL and source and drain regions (not shown) may constitute a MOS transistor to function as an access device. The source and drain regions may be formed in a part of the active region 11 located between adjacent gate lines GL. Alternatively, the first contact layer 30 and/or the second contact layer 32 may function as the source and drain regions.

The first contact layer 30 and the second contact layer 32 may be outside of the gate line GL. The first contact layer 30 and the second contact layer 32 may be buried in the substrate 10. For example, top surfaces of the first contact layer 30 and the second contact layer 32 may be level with a top surface of the capping layer 23 of the gate line GL or may have a height lower than the top surface of the capping layer 23. Here, "height" denotes a distance from the substrate 10.

The first contact layer 30 may be electrically connected to the active region 11 of the substrate 10. The first contact layer 30 may have less contact resistance with respect to the active region 11 of the substrate 10 than the memory cell contact plug MP. The second contact layer 32 may be electrically connected to the active region 11 of the substrate 10. The second contact layer 32 may have less contact resistance with respect to the active region 11 of the substrate 10 than the source line contact plug SP. The first contact layer 30 and the second contact layer 32 may include a silicide material, for example, metal silicide. The metal may include one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb). The first contact layer 30 and the second contact layer 32 may include the same material or different materials.

A first interlayer insulation layer 40 and a second interlayer insulation layer 42 may be sequentially on the gate line GL. The first and second interlayer insulation layers 40 and 42 may include oxide, nitride, and oxynitride, for example, at least one of silicon oxide, silicon nitride, and silicon oxynitride. The first and second interlayer insulation layers 40 and 42 may include the same material or different materials. The first and second interlayer insulation layers 40 and 42 may be formed by using a method such as sputtering, chemical vapor deposition (CVD), plasma enhanced CVD (PECVD), or atomic layer deposition (ALD). The first and second interlayer insulation layers 40 and 42 may be planarized by performing a planarization process using a chemical mechanical polishing (CMP) method or a dry etch method.

In FIG. 3, although the first and second interlayer insulation layers 40 and 42 are illustrated to be separated from each other, example embodiments of the inventive concepts are not limited thereto. For example, the first and second interlayer insulation layers 40 and 42 may be one layer.

The first and second interlayer insulation layers 40 and 42 may expose the first contact layer 30. The first interlayer insulation layers 40 may expose the second contact layer 32. The memory cell contact plug MP may be on the exposed first contact layer 30. The source line contact plug SP may be on the exposed second contact layer 32.

The memory cell contact plug MP and the source line contact plug SP may include, for example, at least one of titanium (Ti), titanium nitride (TiN), tungsten (W), and tungsten nitride (WN), or a stacked structure of the above materials. The memory cell contact plug MP and the source line contact plug SP may be formed by using a method such as sputtering, CVD, PECVD, or ALD. The memory cell contact plug MP and the source line contact plug SP may be formed by forming contact holes by using a typical photolithography method and/or an etch method, filling the contact holes with a conductive material, and performing a planarization process using a CMP method or a dry etch method.

The source line SL may be on the first interlayer insulation layer 40 and electrically connected to the source line contact plug SP. Accordingly, the active region 11 of the substrate 10 and the source line SL may be electrically connected to each other via the second contact layer 32 and the source line contact plug SP. The source line SL may include a conductive material, for example, metal such as aluminum (Al), copper (Cu), tungsten (W), titanium (Ti), or tantalum (Ta), or an alloy such as titanium tungsten (TiW) or titanium aluminum (TiAl), or carbon (C). The source line SL may include titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), or tantalum carbonitride (TaCN). Also, the source line SL may have a stacked structure of the above-described materials.

The memory cell contact plug MP may be within the first and second interlayer insulation layers 40 and 42 and electrically connected to the first contact layer 30. The variable resistive memory cell 60 may be on the memory cell contact plug MP. Accordingly, the active region 11 of the substrate 10 and the variable resistive memory cell 60 may be electrically connected to each other via the first contact layer 30 and the memory cell contact plug MP.

The variable resistive memory cell 60 may perform a memory function by using a resistance variation such as magnetoresistance by an electrical signal due to the gate line GL.

The variable resistive memory cell 60 may include a lower electrode 61, a lower magnetic layer 62, an upper magnetic layer 64, a tunnel barrier layer 66, and an upper electrode 68. The lower magnetic layer 62, the upper magnetic layer 64, and the tunnel barrier layer 66 may be interposed between the lower and upper electrodes 61 and 68. The lower magnetic layer 62, the upper magnetic layer 64, and the tunnel barrier layer 66 may constitute a magnetic tunnel junction (MTJ) or a spin valve. For example, when the tunnel barrier layer 66 is insulative, the lower magnetic layer 62, the upper magnetic layer 64, and the tunnel barrier layer 66 may constitute an MTJ. For example, when the tunnel barrier layer 66 is conductive, the lower magnetic layer 62, the upper magnetic layer 64, and the tunnel barrier layer 66 may constitute a spin valve.

The lower electrode 61 may be on the second interlayer insulation layer 42 and electrically connected to the memory cell contact plug MP. The lower electrode 61 may be formed using a typical etch method, a damascene method, or a dual damascene method. The lower electrode 61 may include a metal such as aluminum (Al), copper (Cu), tungsten (W), titanium (Ti), or tantalum (Ta), or an alloy such as titanium tungsten (TiW) or titanium aluminum (TiAl), or carbon (C). The lower electrode 61 may include titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), or tantalum carbonitride (TaCN). Also, the lower electrode 61 may have a stacked structure of the above-described materials.

The lower magnetic layer 62, the tunnel barrier layer 66, and the upper magnetic layer 64 may be sequentially stacked on the lower electrode 61. The lower electrode 61 may be electrically connected to the lower magnetic layer 62. The tunnel barrier layer 66 may be interposed between the upper and lower magnetic layers 62 and 64. The lower magnetic layer 62, the upper magnetic layer 64, and the tunnel barrier layer 66 may constitute an MTJ or a spin valve. For example, when the tunnel barrier layer 66 is insulative, the lower magnetic layer 62, the upper magnetic layer 64, and the tunnel barrier layer 66 may constitute an MTJ. For example, when the tunnel barrier layer 66 is conductive, the lower magnetic layer 62, the upper magnetic layer 64, and the tunnel barrier layer 66 may constitute a spin valve.

The lower magnetic layer 62 and the upper magnetic layer 64 each may have a perpendicular magnetization direction. For example, the perpendicular magnetization direction may be perpendicular to the surface of the substrate 10. A memory operating method of the variable resistive memory cell 60 using the perpendicular magnetization direction is described below with reference to FIGS. 4 to 7. However, example embodiments of inventive concepts are not limited thereto and a case in which the lower and upper magnetic layer 62 and 64 each have a horizontal magnetization direction is included in the technical scope of example embodiments of the inventive concepts.

The tunnel barrier layer 66 performs a function to change the magnetization direction of the lower magnetic layer 62 or the upper magnetic layer 64 as electrons tunnel through the tunnel barrier layer 66. Thus, the tunnel barrier layer 66 may have a thin thickness so that electrons may tunnel. The tunnel barrier layer 66 may be insulative and include, for example, oxide, nitride, or oxynitride. The tunnel barrier layer 66 may include, for example, at least one of magnesium oxide, magnesium nitride, magnesium oxynitride, silicon oxide, silicon nitride, silicon oxynitride, silicon carbonate, aluminum oxide, aluminum nitride, aluminum oxynitride, calcium oxide, nickel oxide, hafnium oxide, tantalum oxide, zirconium oxide, and manganese oxide. Also, the tunnel barrier layer 66 may be conductive and include, for example, non-magnetic transition metal, and for example, at least one of copper (Cu), gold (Au), tantalum (Ta), silver (Ag), copper-platinum (CuPt), and copper-manganese (CuMn).

The upper electrode 68 may be on the upper magnetic layer 64 and may be electrically connected to the upper magnetic layer 64. The upper electrode 68 may include a metal such as aluminum (Al), copper (Cu), tungsten (W), titanium (Ti), or tantalum (Ta), or an alloy such as titanium tungsten (TiW) or titanium aluminum (TiAl), or carbon (C). The upper electrode 68 may include titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), or tantalum carbonitride (TaCN). Also, the upper electrode 68 may have a stacked structure of the above-described materials. The lower electrode 61 and the upper electrode 68 may be formed of the same material or different materials. The source line SL may be formed of the same material as or a different material than the lower electrode 61 and/or the upper electrode 68.

As described above, when the first and second interlayer insulation layers 40 and 42 are one layer, the source line SL and the lower electrode 61 may be not have a step. For example, the source line SL and the lower electrode 61 may be on the same interlayer insulation layer.

A bit line contact plug 70 may be on the upper electrode 68 and may be electrically connected to the upper electrode 68. The bit line contact plug 70 may include, for example, at least one of titanium (Ti), titanium nitride (TiN), tungsten (W), and tungsten nitride (WN), or a stacked structure of the above materials.

The variable resistive memory cell 60 and the bit line contact plug 70 may be surrounded by a third interlayer insulation layer 80. The third interlayer insulation layer 80 may include oxide, nitride, and oxynitride, for example, at least one of silicon oxide, silicon nitride, and silicon oxynitride.

The bit line BL may be on the bit line contact plug 70. The bit line contact plug 70 may be electrically connected to the bit line BL.

FIGS. 4 to 7 are views for explaining a method of storing data using a magnetization direction of the variable resistive memory cell 60 of FIG. 3. In FIGS. 4 to 7, the lower electrode 61 and the upper electrode 68 are not illustrated.

Referring to FIG. 3, when the gate line GL is turned on, the source line SL and the bit line BL are electrically connected to each other via the variable resistive memory cell 60. When the direction of current flowing in the variable resistive memory cell 60 is changed, a magnetoresistance value of at least one of the lower magnetic layer 62 and the upper magnetic layer 64 included in the variable resistive memory cell 60 changes, and thus the magnetic memory layer 60 may store data "0" or "1". For example, as the magnetization directions of the lower and upper magnetic layers 62 and 64 are parallel or anti-parallel to each other, data may be stored.

Figure 4:
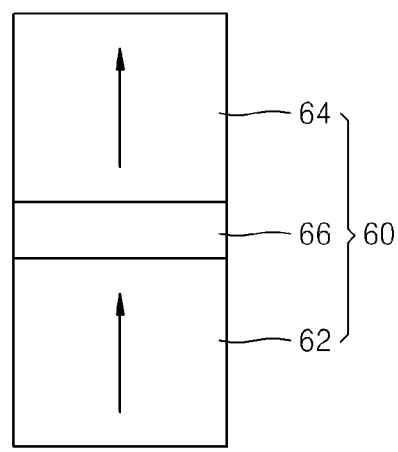
FIGS. 4 to 7 are views for explaining a method of storing data using a magnetization direction of the variable resistive memory cell of FIG. 3.
Figure 5:
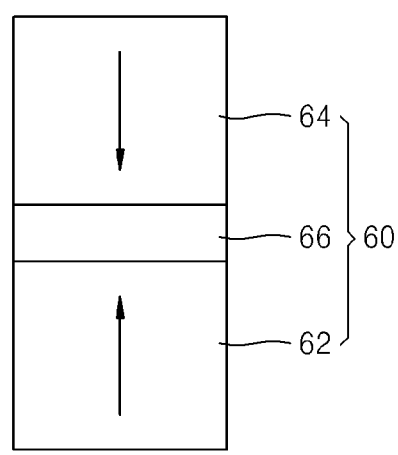

In FIGS. 4 and 5, it is assumed that the lower magnetic layer 62 is a pinned layer in which the magnetization direction is pinned and the upper magnetic layer 64 is a free layer in which the magnetization direction is changed. It is also assumed that the magnetization direction of the lower magnetic layer 62 is pinned in an upward direction. Although it is not illustrated, a pinning layer for pinning the magnetization direction of the pinned layer may be further provided above or under the pinned layer and the pinning layer may include an anti-ferromagnetic material.

Referring to FIGS. 3 and 4, when the gate line GL is turned on and current flows from the source line SL to the bit line BL, the magnetization tends to be in the upward direction along a magnetization easy axis. Accordingly, the lower and upper magnetic layers 62 and 64 have an upward, parallel magnetization direction, which indicates a low resistance state. Data "0" may be stored in the low resistance state.

Referring to FIGS. 3 and 5, when the gate line GL is turned on and current flows from the bit line BL to the source line SL, the magnetization tends to be in the downward direction contrary to the magnetization easy axis. Since the upper magnetic layer 64 is a free layer, the magnetization direction is changed to the downward direction. However, the lower magnetic layer 62 that is a pinned layer has the upward magnetization direction without change. Accordingly, the lower and upper magnetic layers 62 and 64 have an anti-parallel magnetization direction, which indicates a high resistance state. Data "1" may be stored in the high resistance state.

In the meantime, when the magnetization direction of the lower magnetic layer 62 is pinned in the downward direction, data may be stored in the opposite manner. For example, when current flows from the source line SL to the bit line BL, data "1" may be stored and, when current flows from the bit line BL to the source line SL, data "0" may be stored.

Figure 6:
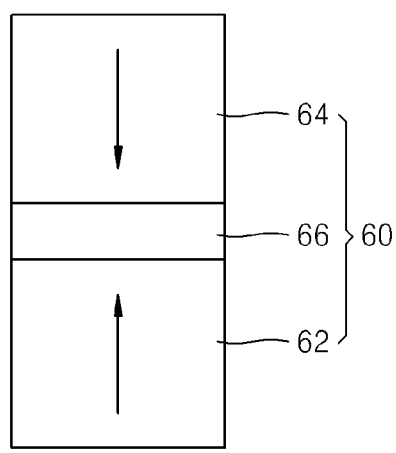
Figure 7:
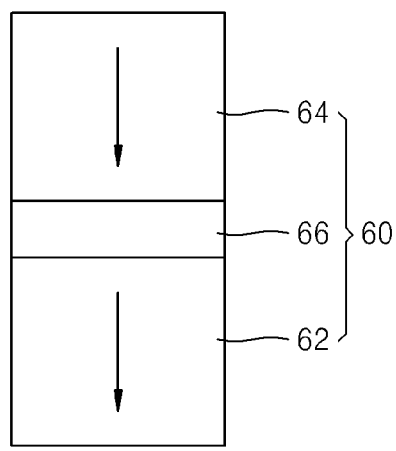

In FIGS. 6 and 7, it is assumed that the lower magnetic layer 62 is a free layer in which the magnetization direction is changed and the upper magnetic layer 64 is a pinned layer in which the magnetization direction is pinned. It is also assumed that the magnetization direction of the upper magnetic layer 64 is pinned in a downward direction.

Referring to FIGS. 3 and 6, when the gate line GL is turned on and current flows from the source line SL to the bit line BL, the magnetization tends to be in the upward direction along a magnetization easy axis. Since the lower magnetic layer 62 is a free layer, the magnetization direction is changed to the upward direction. However, the upper magnetic layer 64 that is a pinned layer has the downward magnetization direction without change. Accordingly, the lower and upper magnetic layers 62 and 64 have an anti-parallel magnetization direction, which indicates a high resistance state. Data "1" may be stored in the high resistance state.

Referring to FIGS. 3 and 7, when the gate line GL is turned on and current flows from the bit line BL to the source line SL, the magnetization tends to be in the downward direction contrary to the magnetization easy axis. Accordingly, the lower and upper magnetic layers 62 and 64 have a downward, parallel magnetization direction, which indicates a low resistance state. Data "0" may be stored in the low resistance state.

If the magnetization direction of the upper magnetic layer 64 is pinned in the upward direction, data may be stored in the opposite manner. For example, when current flows from the source line SL to the bit line BL, data "0" may be stored and, when current flows from the bit line BL to the source line SL, data "1" may be stored.

As illustrated in FIGS. 4 to 7, when the lower and upper magnetic layers 62 and 64 store data according to the magnetization direction, a value of the current flowing in the variable resistive memory cell 60 is changed. The stored data may be read out by sensing a difference in the current value.

Although FIGS. 4 to 7 illustrate a case in which the lower and upper magnetic layers 62 and 64 each have a perpendicular magnetization direction, this is an example and a case in which the lower and upper magnetic layers 62 and 64 each have a horizontal magnetization direction is included in the technical scope of example embodiments of inventive concepts.

FIGS. 8 to 13 are cross-sectional views illustrating a method of manufacturing the variable resistive semiconductor device 1 of FIG. 3, according to some example embodiments of inventive concepts. FIGS. 8 to 13 illustrate cross-sections taken along line III-III of FIG. 2 and cross-sections taken along line IV-IV of FIG. 2.

Figure 8:
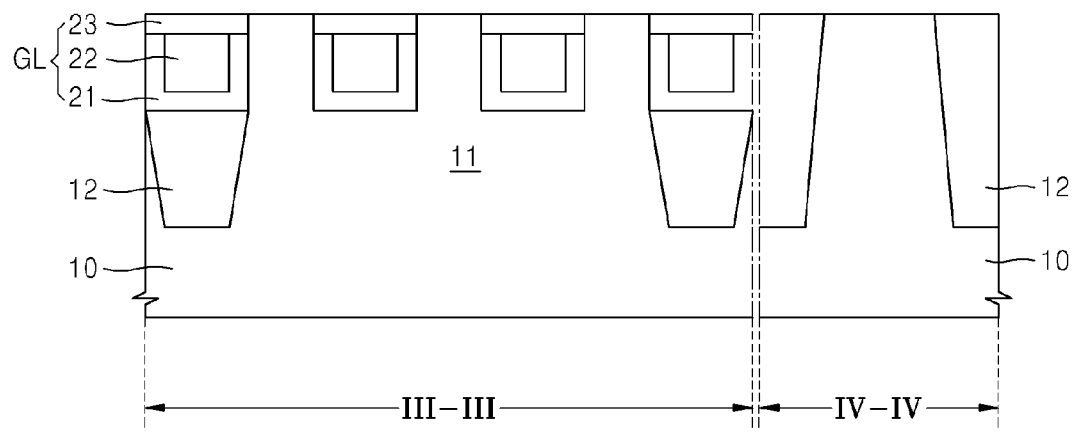
FIGS. 8 to 13 are cross-sectional views illustrating a method of manufacturing the variable resistive semiconductor device of FIG. 3, according to some example embodiments of inventive concepts.

Referring to FIG. 8, a substrate 10 is provided. Isolation layers 12 for defining the active region 11 are formed within the substrate 10. Gate lines GL each including an insulation layer 21, a gate electrode layer 22, and a capping layer 23 are formed between the isolation layers 12 of the substrate 10. Although the gate lines GL constitute buried transistors in the present example embodiment, this is only an example, and the gate lines GL may constitute planar transistors.

Figure 9:
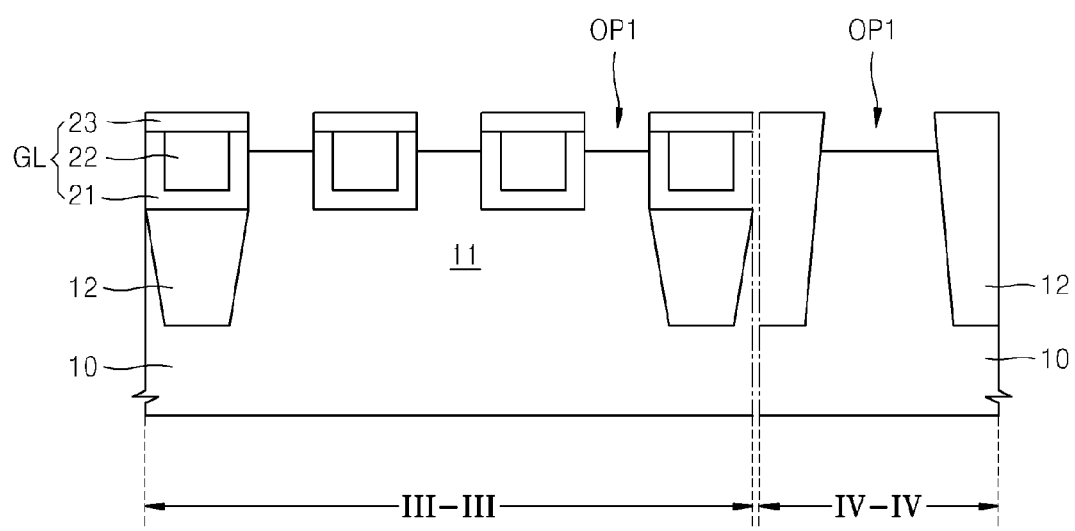

Referring to FIG. 9, openings OP1 are formed in the substrate 10 by recessing portions of the substrate 10 between the gate lines GL. The openings OP1 may be formed by lithography or etch back.

Figure 10:
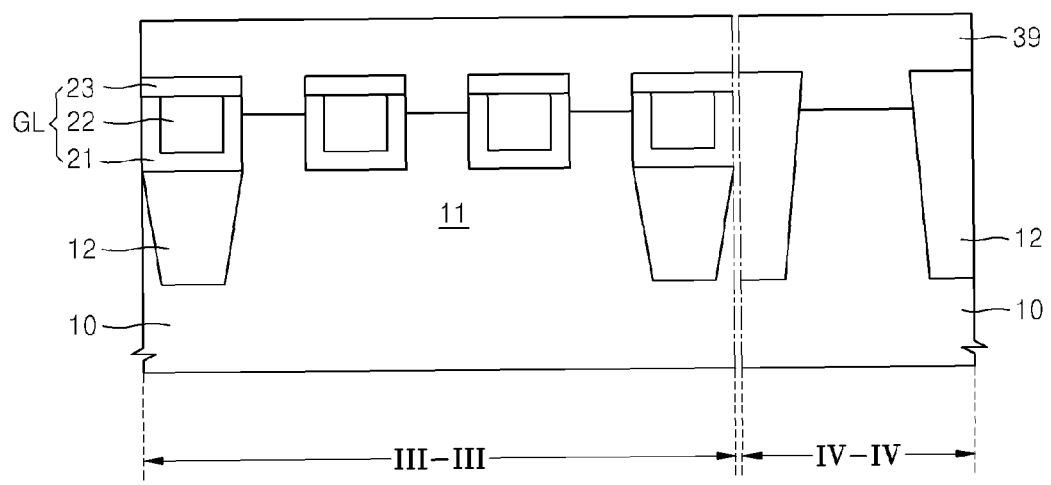

Referring to FIG. 10, a sacrificial layer 39 is formed on the gate lines GL. The sacrificial layer 39 may fill the openings OP1. The sacrificial layer 39 may include a conductive material, for example, metal. The sacrificial layer 39 may include one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb). The sacrificial layer 39 may be formed by using a method such as sputtering, CVD, PECVD, or ALD.

Figure 11:
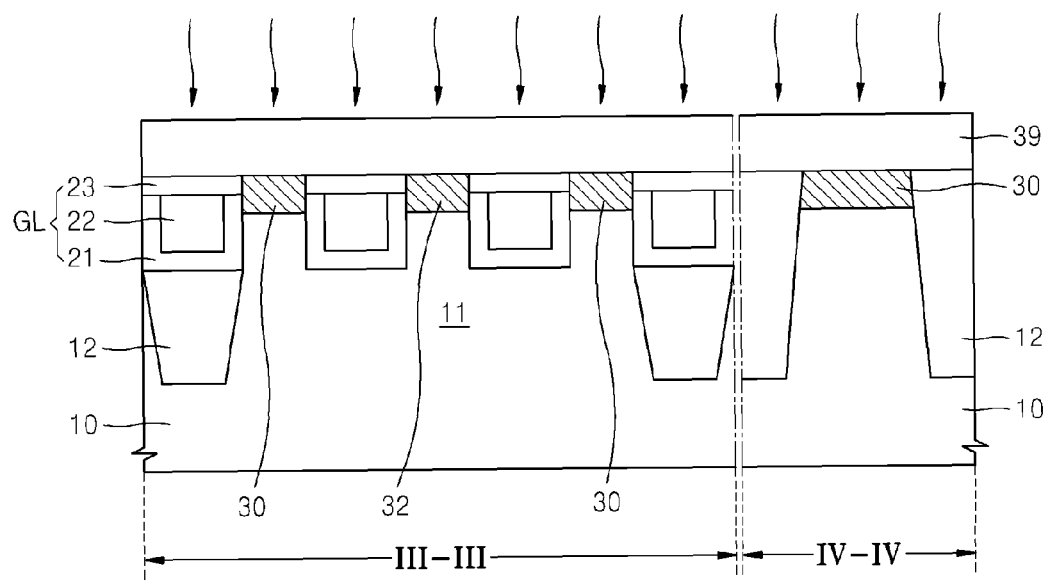

Referring to FIG. 11, the first and second contact layers 30 and 32 are formed by thermally treating the sacrificial layer 39. The first contact layer 30 and the second contact layer 32 may be between the gate lines GL. The first contact layer 30 and the second contact layer 32 may be formed by a reaction between the materials of the sacrificial layer 39 and the substrate 10, and may include, for example, a silicide material. In other words, the first contact layer 30 and the second contact layer 32 may include a metal silicide material formed by a reaction of the metal material of the sacrificial layer 39 with the silicon material of the substrate 10. The first contact layer 30 and the second contact layer 32 may be formed in the same process or different processes.

Figure 12:
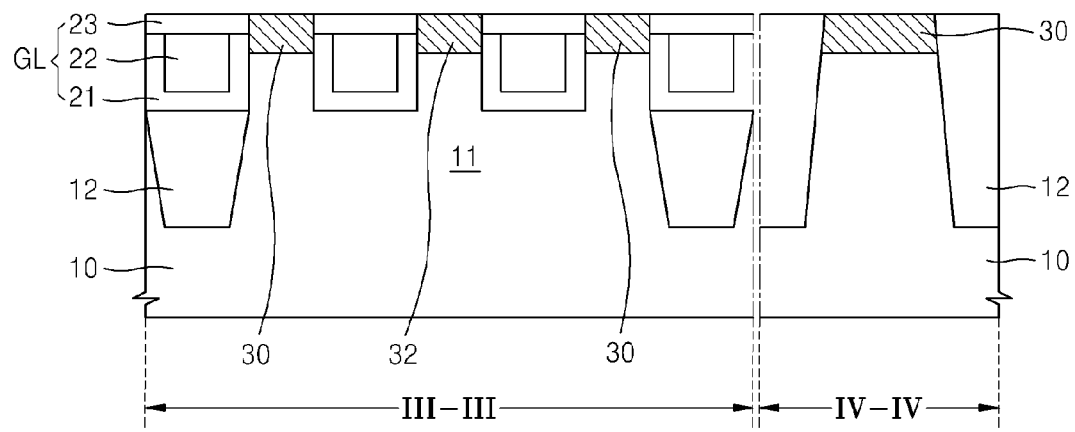

Referring to FIG. 12, the first and second contact layers 30 and 32 are exposed by removing the sacrificial layer 39. The removing process may be performed using a planarization process such as CMP or etchback. The first contact layer 30 and the second contact layer 32 may be buried in the substrate 10. For example, top surfaces of the first contact layer 30 and the second contact layer 32 may be level with top surfaces of the capping layers 23 of the gate lines GL or may have a height lower than the top surfaces of the capping layers 23.

A metal silicide material forming the first contact layer 30 and the second contact layer 32 may be deposited to be higher than the gate lines GL by the thermal treatment of FIG. 11. However, the metal silicide material forming the first contact layer 30 and the second contact layer 32 may be deposited to be level with or lower than the gate lines GL by the planarization process of FIG. 12.

Figure 13:
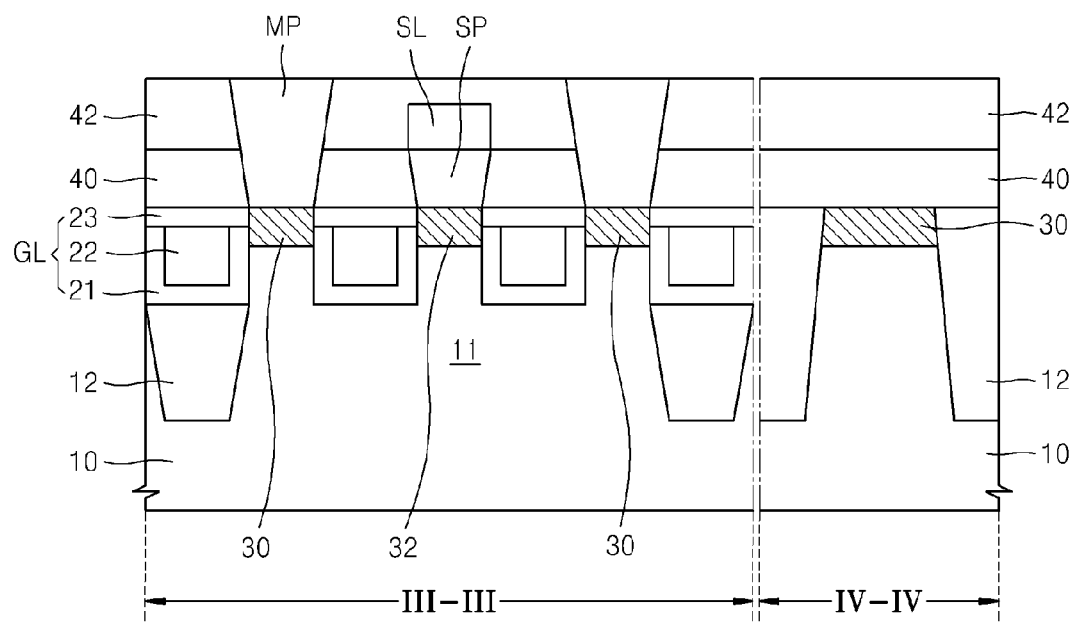

Referring to FIG. 13, the memory cell contact plug MP formed on the first contact layer 30 is electrically connected to the first contact layer 30. The source line contact plug SP formed on the second contact layer 32 is electrically connected to the second contact layer 32. The memory cell contact plug MP may be surrounded by the first and second interlayer insulation layers 40 and 42. The source line contact plug SP may be surrounded by the first interlayer insulation layer 40.

The variable resistive memory cell 60, the source line SL, and the bit line BL are formed to complete the variable resistive memory device 1 of FIG. 3.

Figure 14:
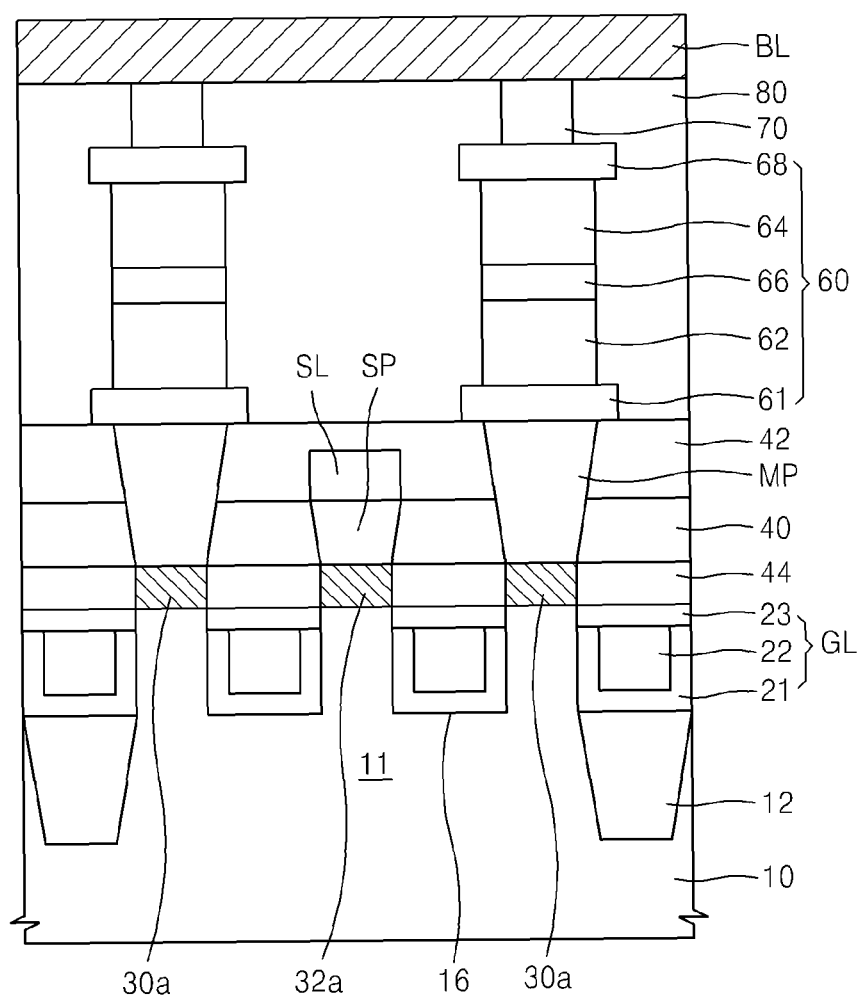
FIG. 14 is a cross-sectional view of a variable resistive memory device according to some example embodiments of inventive concepts.

FIG. 14 is a cross-sectional view of a variable resistive memory device 2 according to some example embodiments of inventive concepts. The variable resistive memory device 2 according to the present example embodiments is a modification of the variable resistive memory device 1 described above with reference to FIGS. 2 to 13, so a description of duplicate matters will be omitted.

Referring to FIG. 14, the variable resistive memory device 2 may include a substrate 10, a gate line GL, a variable resistive memory cell 60, a source line SL, and a bit line BL.

The variable resistive memory device 2 may further include a source line contact plug SP electrically connecting the source line SL to an active region 11 of the substrate 10, and a memory cell contact plug MP electrically connecting the variable resistive memory cell 60 to the active region 11 of the substrate 10.

The variable resistive memory device 2 may further include a first contact layer 30a between the source line contact plug SP and the active region 11 of the substrate 10 that has less contact resistance with respect to the active region 11 of the substrate 10 than the source line contact plug SP. The variable resistive memory device 2 may further include a second contact layer 32a between the memory cell contact plug MP and the active region 11 of the substrate 10 that has less contact resistance with respect to the active region 11 of the substrate 10 than the memory cell contact plug MP.

The gate line GL may be on the active region 11 of the substrate 10. According to an example embodiment, the gate line GL may constitute a buried transistor. The gate line GL may include an insulation layer 21, a gate electrode layer 22, and a capping layer 23. The gate electrode layer 22 may correspond to the word line WL of FIG. 1. The gate line GL and source and drain regions (not shown) may constitute a MOS transistor to function as an access device.

The first contact layer 30a and the second contact layer 32a may be outside the gate line GL. The first contact layer 30a and the second contact layer 32a may be within an auxiliary insulation layer 44. A first interlayer insulation layer 40 and a second interlayer insulation layer 42 may be on the auxiliary insulation layer 44.

Top surfaces of the first contact layer 30a and the second contact layer 32a may have a height higher than the top surface of the capping layer 23 of the gate line GL. The top surfaces of the first contact layer 30a and the second contact layer 32a may be level with the top surface of the capping layer 23 of the gate line GL or may have a height lower than the top surface of the capping layer 23.

The first contact layer 30a may have less contact resistance with respect to the active region 11 of the substrate 10 than the memory cell contact plug MP. The second contact layer 32a may have less contact resistance with respect to the active region 11 of the substrate 10 than the source line contact plug SP. The first contact layer 30a and the second contact layer 32a may include a silicide material, for example, metal silicide. The metal may include one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb). The first contact layer 30a and the second contact layer 32a may include the same material or different materials.

The memory cell contact plug MP may be on the first contact layer 30a exposed through the first and second interlayer insulation layers 40 and 42. The source line contact plug SP may be on the second contact layer 32a exposed through the first interlayer insulation layer 40.

The source line SL may be on the first interlayer insulation layer 40 to be electrically connected to the source line contact plug SP. Accordingly, the active region 11 of the substrate 10 and the source line SL may be electrically connected to each other via the second contact layer 32a and the source line contact plug SP.

The memory cell contact plug MP, which is electrically connected to the first contact layer 30a, may be within the first and second interlayer insulation layers 40 and 42. The variable resistive memory cell 60 may be on the memory cell contact plug MP. Accordingly, the active region 11 of the substrate 10 and the variable resistive memory cell 60 may be electrically connected to each other via the first contact layer 30a and the memory cell contact plug MP.

FIGS. 15 to 20 are cross-sectional views illustrating a method of manufacturing the variable resistive semiconductor device 2 of FIG. 14, according to some example embodiments of inventive concepts. FIGS. 15 to 20 illustrate cross-sections taken along line III-III of FIG. 2 and cross-sections taken along line IV-IV of FIG. 2.

Figure 15:
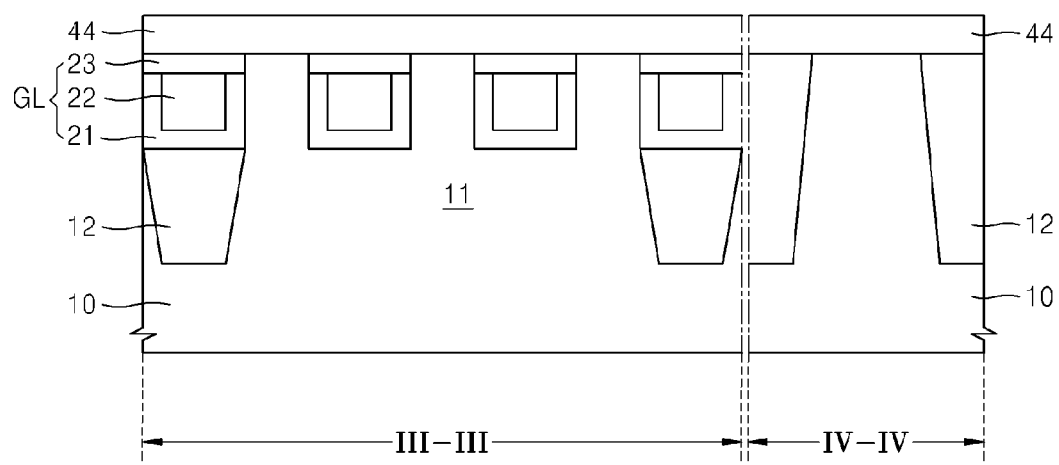
FIGS. 15 to 20 are cross-sectional views illustrating a method of manufacturing the variable resistive semiconductor device of FIG. 14, according to some example embodiments of inventive concepts.

Referring to FIG. 15, a substrate 10 is provided. Isolation layers 12 for defining the active region 11 are formed within the substrate 10. Gate lines GL, each including an insulation layer 21, a gate electrode layer 22, and a capping layer 23 are formed between the isolation layers 12 of the substrate 10. Although the gate lines GL constitute buried transistors in the present example embodiment, this is only an example, and the gate lines GL may constitute planar transistors. An auxiliary insulation layer 44 covering the gate lines GL is formed on the substrate 10.

Figure 16:
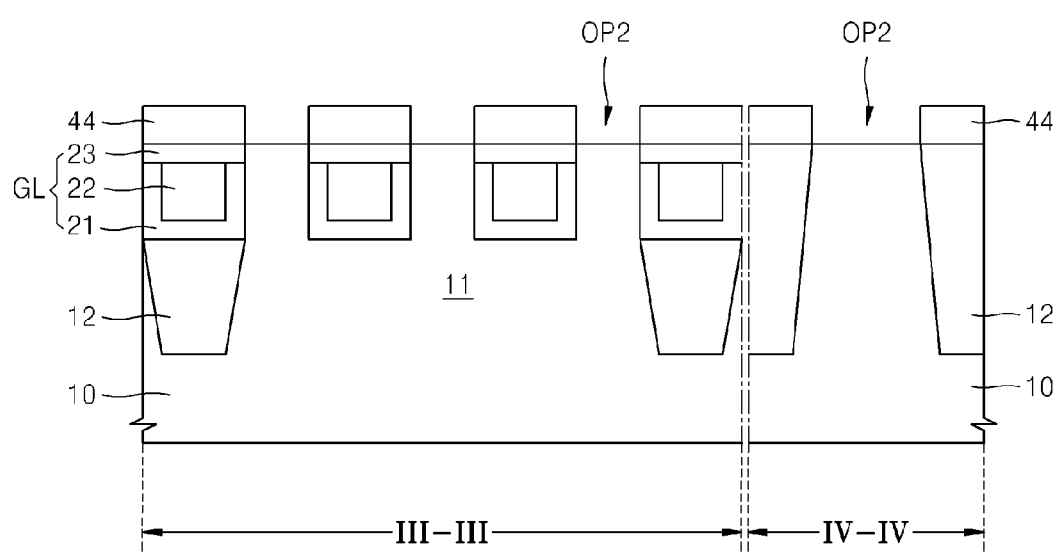

Referring to FIG. 16, openings OP2 exposing portions of the substrate 10 between the gate lines GL are formed by recessing the portions of the substrate 10 between the gate lines GL. The openings OP2 may be formed by lithography or etch back.

Figure 17:
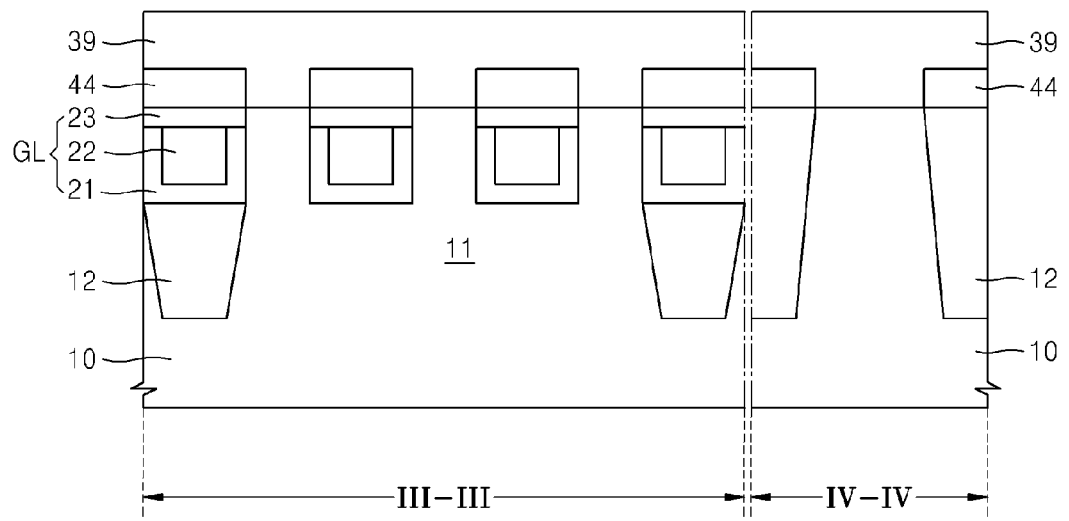

Referring to FIG. 17, a sacrificial layer 39 is formed on the gate lines GL. The sacrificial layer 39 may fill the openings OP2. The sacrificial layer 39 may include a conductive material, for example, metal. The sacrificial layer 39 may include one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb). The sacrificial layer 39 may be formed by using a method such as sputtering, CVD, PECVD, or ALD.

Figure 18:
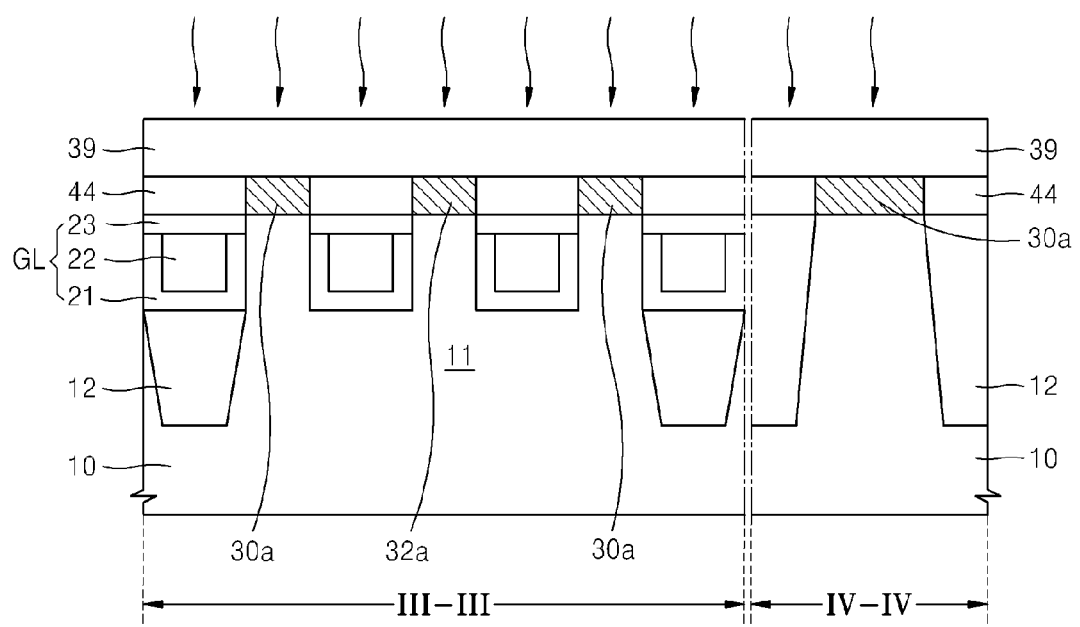

Referring to FIG. 18, the first and second contact layers 30a and 32a are formed by thermally treating the sacrificial layer 39. The first contact layer 30a and the second contact layer 32a may be between the gate lines GL. The first contact layer 30a and the second contact layer 32a may be buried in the substrate 10. The first contact layer 30a and the second contact layer 32a may be formed by a reaction between the materials of the sacrificial layer 39 and the substrate 10, and may include, for example, a silicide material. In other words, the first contact layer 30a and the second contact layer 32a may include a metal silicide material formed by a reaction of the metal material of the sacrificial layer 39 with the silicon material of the substrate 10. The first contact layer 30a and the second contact layer 32a may be formed in the same process or different processes.

Figure 19:
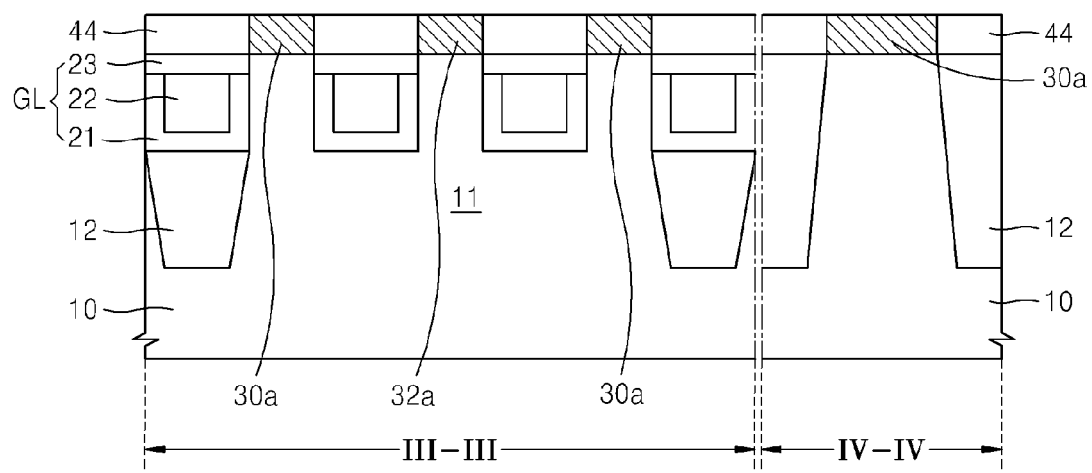

Referring to FIG. 19, the first and second contact layers 30a and 32a are exposed by removing the sacrificial layer 39. The removing process may be performed by CMP or etchback.

The first contact layer 30a and the second contact layer 32a may protrude more than the gate lines GL. Top surfaces of the first contact layer 30a and the second contact layer 32a may have a height higher than the top surfaces of the capping layers 23 of the gate lines GL. The top surfaces of the first contact layer 30a and the second contact layer 32a may be level with the top surfaces of the capping layers 23 of the gate lines GL or may have a height lower than the top surfaces of the capping layers 23.

A metal silicide material forming the first contact layer 30a and the second contact layer 32a may be deposited to be higher than the gate lines GL by the thermal treatment of FIG. 18. However, the metal silicide material forming the first contact layer 30a and the second contact layer 32a may be deposited to be level with or lower than the gate lines GL by the planarization process of FIG. 19.

Figure 20:
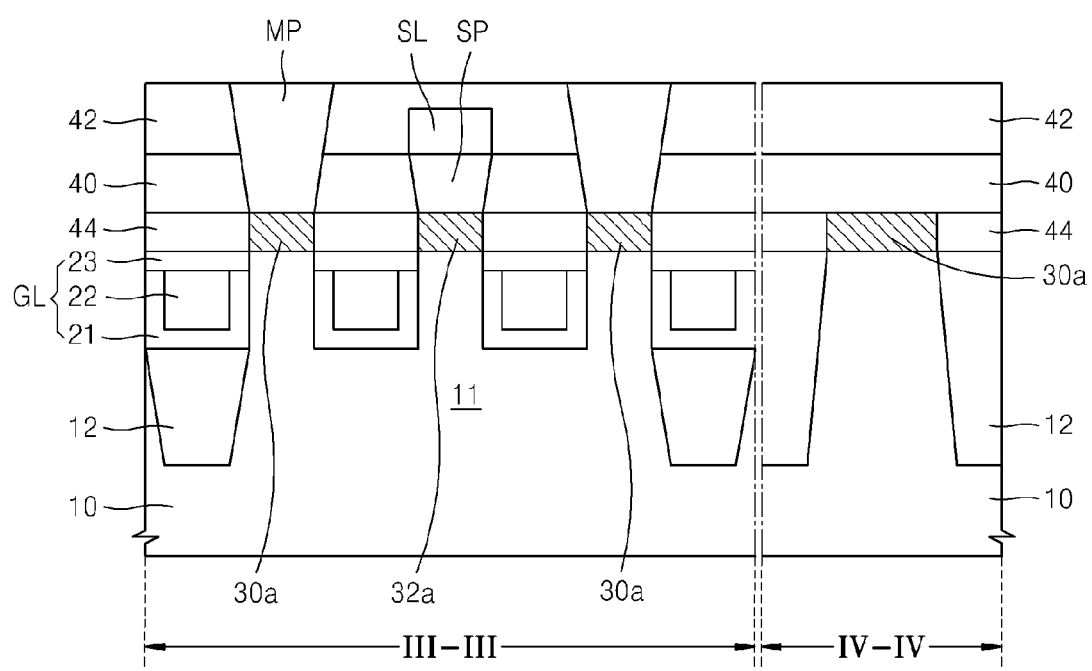

Referring to FIG. 20, the memory cell contact plug MP is formed on the first contact layer 30a to be is electrically connected to the first contact layer 30a. The source line contact plug SP is formed on the second contact layer 32a to be electrically connected to the second contact layer 32a. The memory cell contact plug MP may be surrounded by the first and second interlayer insulation layers 40 and 42. The source line contact plug SP may be surrounded by the first interlayer insulation layer 40.

The variable resistive memory cell 60, the source line SL, and the bit line BL are formed to complete the variable resistive memory device 2 of FIG. 14.

Figure 21:
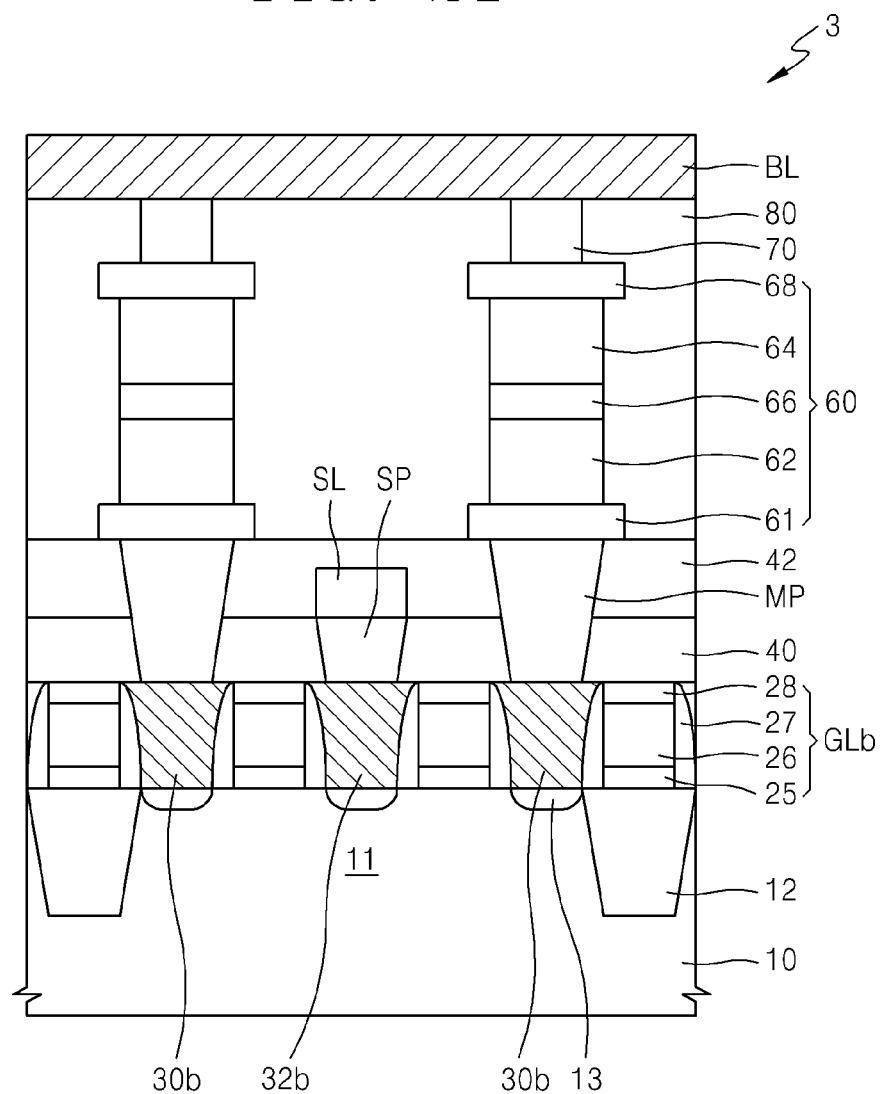
FIG. 21 is a cross-sectional view of a variable resistive memory device according to some example embodiments of inventive concepts.

FIG. 21 is a cross-sectional view of a variable resistive memory device 3 according to some example embodiments of inventive concepts. The variable resistive memory device 3 according to the present example embodiments is a modification of the variable resistive memory devices 1 and 2 described above with reference to FIGS. 1 to 20, so a description of duplicate matters will be omitted. According to the present example embodiment, a gate line GL constitutes a planar transistor.

Referring to FIG. 21, the variable resistive memory device 3 may include a substrate 10, a gate line GL, a variable resistive memory cell 60, a source line SL, and a bit line BL.

The variable resistive memory device 3 may further include a source line contact plug SP electrically connecting the source line SL to an active region 11 of the substrate 10, and a memory cell contact plug MP electrically connecting the variable resistive memory cell 60 to the active region 11 of the substrate 10.

The variable resistive memory device 3 may further include a first contact layer 30b between the source line contact plug SP and the active region 11 of the substrate 10 that has less contact resistance with respect to the active region 11 of the substrate 10 than the source line contact plug SP. The variable resistive memory device 3 may further include a second contact layer 32b between the memory cell contact plug MP and the active region 11 of the substrate 10 that has less contact resistance with respect to the active region 11 of the substrate 10 than the memory cell contact plug MP.

The gate line GL may be on the active region 11 of the substrate 10. According to an example embodiment, the gate line GL may constitute a planar transistor. The gate line GL may include an insulation layer 25, a gate electrode layer 26, a capping layer 27, and a spacer 28. The gate electrode layer 26 may correspond to the word line WL of FIG. 1. The gate line GL and a source/drain region 13 may constitute a MOS transistor to function as an access device.

The first contact layer 30b and the second contact layer 32b may be outside the gate line GL. Top surfaces of the first contact layer 30b and the second contact layer 32b may be level with the top surface of the capping layer 27 of the gate line GL or may have a height lower than the top surface of the capping layer 27.

The first contact layer 30b may have less contact resistance with respect to the active region 11 of the substrate 10 than the memory cell contact plug MP. The second contact layer 32b may have less contact resistance with respect to the active region 11 of the substrate 10 than the source line contact plug SP. The first contact layer 30b and the second contact layer 32b may include a silicide material, for example, metal silicide. The metal may include one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb). The first contact layer 30b and the second contact layer 32b may include the same material or different materials.

The memory cell contact plug MP may be on the first contact layer 30b exposed through the first and second interlayer insulation layers 40 and 42. The source line contact plug SP may be on the second contact layer 32b exposed through the first interlayer insulation layer 40.

The source line SL may be on the first interlayer insulation layer 40 to be electrically connected to the source line contact plug SP. Accordingly, the active region 11 of the substrate 10 and the source line SL may be electrically connected to each other via the second contact layer 32b and the source line contact plug SP.

The memory cell contact plug MP, which is electrically connected to the first contact layer 30b, may be within the first and second interlayer insulation layers 40 and 42. The variable resistive memory cell 60 may be on the memory cell contact plug MP. Accordingly, the active region 11 of the substrate 10 and the variable resistive memory cell 60 may be electrically connected to each other via the first contact layer 30b and the memory cell contact plug MP.

Figure 22:
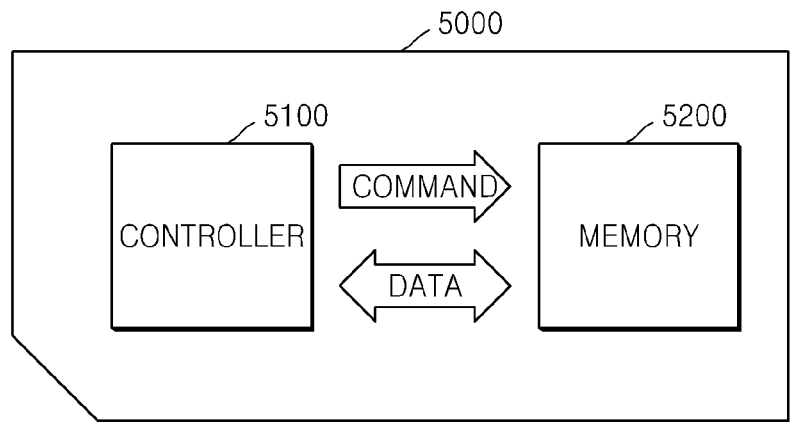
FIG. 22 is a block diagram of a memory card according to an example embodiment of inventive concepts.

FIG. 22 is a schematic view illustrating an example embodiment of a memory card 5000 according to an example embodiment of inventive concepts.

Referring to FIG. 22, a controller 5100 and a memory 5200 are configured to send/receive electric signals to/from each other. For example, when the controller 5100 gives a command to the memory 5200, the memory 5200 can send data. The memory 5200 can include the non-volatile memory device 100, according to an example embodiment of inventive concepts. The non-volatile memory devices according to the various example embodiments of inventive concepts can be in NAND or NOR architecture arrays in correspondence to the logic gate design. Such NAND and NOR arrays are generally known in the art. The memory arrays in a plurality of rows and columns can have one or more memory array bank (not shown). The memory 5200 can include the memory array (not shown) or the memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 23:
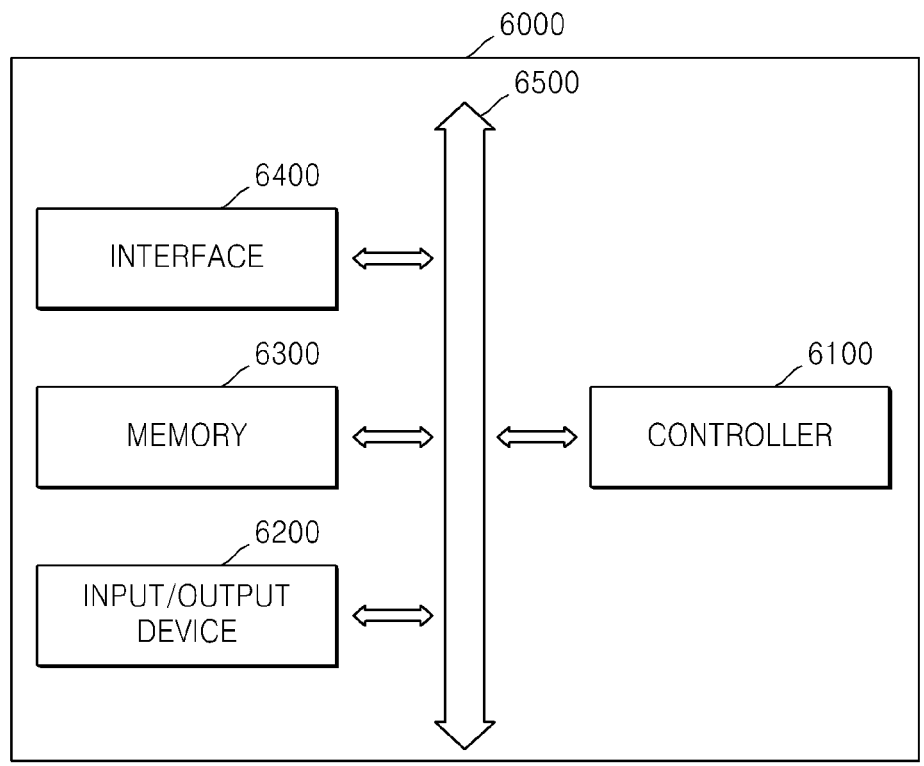
FIG. 23 is a schematic block diagram of a system according to an example embodiment of inventive concepts.

FIG. 23 is a schematic diagram of a system 6000 according to an example embodiment of inventive concepts.

Referring to FIG. 23, the system 6000 may include a controller 6100, an input/output device 6200, a memory 6300, and an interface 6400. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or the like. The input/output device 6300 can be used to input or output data of the system 6000. The system 6000 is connected to an external apparatus, for example, a personal computer or a network, using the input/output device 6200, to send/receive data to/from the external apparatus. The input/output device 6200 may be a keypad, a keyboard, or a display. The memory 6300 may store codes and/or data for operating the controller 6100 and/or may store data processed by the controller 6100. The memory 6300 may include a non-volatile memory device according to an example embodiment of inventive concepts. The interface 6400 may be a data transmission path between the system 6000 and an external apparatus. The controller 6100, the input/output device 6200, the memory 6300, and the interface 6400 may communicate with one another by a bus 6500. For example, the system 6000 can be used for a mobile phone, an MP3 player, a navigation system, a portable multimedia player (PMP), a solid state disk (SSD), or a household appliance.

Figure 24:
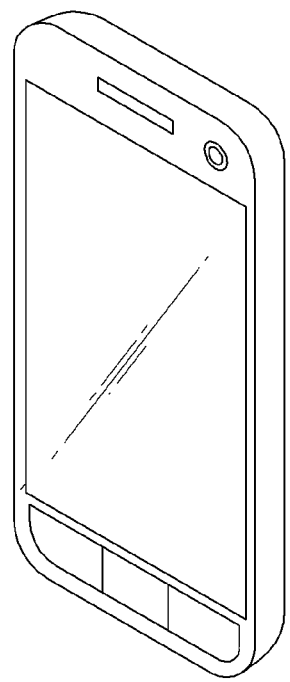
FIG. 24 is a perspective view of an electronic device to which a semiconductor device manufactured according to an example embodiment of inventive concepts is applicable.

FIG. 24 is a perspective view of an electronic device 7000 to which a semiconductor device according to an example embodiment of inventive concepts is applicable.

Referring to FIG. 24, the electronic system 7000 is a case in which the electronic system 5000 (see FIG. 22), 6000 (see FIG. 23) is applied to a mobile phone. Besides the mobile phone, the electronic system 5000 (see FIG. 22), 6000 (see FIG. 23) may also be applicable to an MP3 player, a navigation device, a portable multimedia player (PMP), a solid state disk (SSD), a vehicle, or household appliances.

The foregoing is illustrative of example embodiments and is not to be construed as limiting thereof. Although example embodiments have been described, those of ordinary skill in the art will readily appreciate that many modifications are possible in the example embodiments without materially departing from the novel teachings and advantages of the example embodiments. Accordingly, all such modifications are intended to be included within the scope of the claims. Example embodiments are defined by the following claims, with equivalents of the claims to be included therein.

What is claimed is:

1. A variable resistive memory device comprising:
   a substrate including an active region;
   a gate line on the substrate;
   a first contact layer electrically connected to the active region;
   a memory cell contact plug electrically connected to the first contact layer; and
   a variable resistive memory cell electrically connected to the memory cell contact plug,
   wherein the first contact layer has less contact resistance with respect to the active region than the memory cell contact plug.

2. The variable resistive memory device of claim 1, wherein the first contact layer is buried in the substrate.

3. The variable resistive memory device of claim 1, wherein a top surface of the first contact layer is level with a top surface of the gate line.

4. The variable resistive memory device of claim 1, wherein a bottom surface of the first contact layer is level with the top surface of the gate line.

5. The variable resistive memory device of claim 1, wherein the first contact layer is between the gate lines.

6. The variable resistive memory device of claim 1, wherein the first contact layer is on an area between the gate lines.

7. The variable resistive memory device of claim 1, wherein the first contact layer includes a metal silicide material.

8. The variable resistive memory device of claim 1, further comprising:
    a second contact layer electrically connected to the active region;
    a source line contact plug electrically connected to the second contact layer; and
    a source line electrically connected to the source line contact plug,
    wherein the second contact layer has less contact resistance with respect to the active region than the source line contact plug.

9. The variable resistive memory device of claim 8, wherein the second contact layer is buried in the substrate.

10. The variable resistive memory device of claim 8, wherein the first contact layer and the second contact layer includes the same material.

11. The variable resistive memory device of claim 1, wherein the gate line is buried in the substrate.

12. The variable resistive memory device of claim 1, wherein the gate line is on the substrate.

13. The variable resistive memory device of claim 1, wherein the first contact layer includes at least one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb).

14. The variable resistive memory device of claim 8, wherein the second contact layer includes at least one of titanium (Ti), cobalt (Co), nickel (Ni), tantalum (Ta), platinum (Pt), vanadium (V), erbium (Er), zirconium (Zr), hafnium (Hf), molybdenum (Mo), and ytterbium (Yb).

15. A variable resistive memory device comprising:
    a substrate;
    a contact plug on the substrate; and
    a contact layer between the substrate and the contact plug and having less contact resistance with respect to the substrate than the contact plug.

16. The variable resistive memory device of claim 15, further comprising:
    a variable resistive memory cell electrically connected to the contact plug.

17. A variable resistive memory device comprising:
    a substrate;
    a memory cell contact plug;
    a variable resistive memory cell electrically connected to the memory cell contact plug; and
    a contact layer electrically connected to the memory cell contact plug, the contact layer having a lower contact resistance with respect to the substrate than the memory cell contact plug.

18. The variable resistive memory device of claim 17, wherein the contact layer is between the substrate and memory cell contact plug.

19. The variable resistive memory device of claim 1, wherein the variable resistive memory cell comprises:
    a lower electrode;
    a lower magnetic layer;
    a tunnel barrier layer;
    an upper magnetic layer; and
    an upper electrode.

20. The variable resistive memory device of claim 19, wherein the lower magnetic layer, the upper magnetic layer and the tunnel barrier layer are between the lower electrode and the upper electrode.

* * * * *